United States Patent [19]

Yoon et al.

[11] Patent Number: 4,950,619
[45] Date of Patent: Aug. 21, 1990

[54] METHOD FOR THE FABRICATION OF A HIGH RESISTANCE LOAD RESISTOR UTILIZING SIDE WALL POLYSILICON SPACERS

[75] Inventors: Hee K. Yoon, Seoul; Yeong S. Choi, Kyungki-do; Yoon J. Lee, Seoul, all of Rep. of Korea

[73] Assignee: Hyundai Electronics Industries Co., Ltd., Rep. of Korea

[21] Appl. No.: 434,241

[22] Filed: Nov. 13, 1989

[30] Foreign Application Priority Data

Nov. 12, 1988 [KR] Rep. of Korea .................... 14865/88

[51] Int. Cl.$^5$ ........................................... H01L 27/11
[52] U.S. Cl. ........................................ 437/47; 437/52; 437/60; 437/228; 437/233; 437/918; 357/51
[58] Field of Search ...................... 437/47, 52, 60, 918, 437/228, 235, 160, 161, 162; 357/51; 29/610 R

[56] References Cited

U.S. PATENT DOCUMENTS

| | | | |
|---|---|---|---|
| 4,315,239 | 2/1982 | Domiele et al. | 357/51 |
| 4,464,212 | 8/1984 | Bhatia et al. | 357/51 |
| 4,835,589 | 5/1989 | Pfiester | 357/51 |

*Primary Examiner*—Brian E. Hearn
*Assistant Examiner*—T. Thomas
*Attorney, Agent, or Firm*—Ladas & Parry

[57] ABSTRACT

A high resistance load resistor in a static memory device and the method of fabricating such device is disclosed. The device is fabricated by depositing a first insulating oxide layer on a semiconductor substrate and depositing a first polysilicon layer on the first insulating oxide layer. The first polysilicon layer is etched to form a first polysilicon pad and a second polysilicon pad with the first polysilicon pad spaced apart from the second polysilicon pad. A second oxide layer is deposited on the first polysilicon layer and the first oxide layer. The second oxide layer is etched thereby shaping the second oxide island layer to be contiguously positioned on each of the first and second polysilicon pads and on the first oxide layer extending between the first and second polysilicon layers. The shaped second oxide island layer includes a sidewall in contact with the first oxide layer and extending from and in contact with each of the first and second polysilicon pads. A second polysilicon spacer is then formed along and in contact with the sidewall of the shaped second oxide island layer thereby electrically connecting the first and the second polysilicon pads thereby forming a high resistance load resistor in a static memory device.

6 Claims, 2 Drawing Sheets

METHOD FOR THE FABRICATION OF A HIGH RESISTANCE LOAD RESISTOR UTILIZING SIDE WALL POLYSILICON SPACERS

BACKGROUND OF THE INVENTION

1. Field of Invention

This invention relates to a method for the fabrication of a high resistance load resistor in a highly integrated semiconductor memory device, and more particularly, to a method for fabricating a high resistance load resistor which has high resistance by utilizing polysilicon spacer on the sidewall of dielectrics layer. The resulting resistor can be used in a static memory device.

2. Information Disclosure Statement

In the case of the mega bit capacity SRAM in which a memory cell comprises four transistors and two load resistors, a load resistor having high resistance is required in order to reduce the stand-by current. However, in the case where a lightly doped polysilicon is utilized to make a high resistance load resistor, there is a physical limitation to the length of the resistor so that a high resistance load resistor cannot be obtained since the given cell size is too small in the mega bit static RAM device.

In the prior art, as the density of SRAM is increased, the size of chip is reduced. Therefore, the size of the unit cell should be reduced. Similarly, since there is such limitation to the size of the cell, there is a trend toward a static storage cell which utilizes two load resistors and four transistors rather than six transistors, for more highly integrated devices.

In order to achieve a low stand-by current, lightly doped polysilicon having a high resistance has been used as a load resistor. The resistance of the slightly doped polysilicon depends upon the thickness, the degree of doping and the length of the polysilicon. Accordingly, in the prior art method, the resistor having a few hundred Giga ohms can be obtained by optimizing these parameters, as mentioned above.

However, the length, which the polysilicon resistor can occupy, is extremely limited in the prior art as the density of the devices is increased to mega bits. Therefore, when the fact that the resistance is proportional to the length of material, is considered, it is very difficult to increase the resistance up to the degree of Tera ohm. Of course, an approach to increase the resistance of the polysilicon resistor by decreasing it's thickness to, for example, a few thousand angstroms utilizing multilayered polysilicon may be considered, but this also presents several problems in conjunction with a subsequent step in the manufacturing process.

Therefore, it is an object of the present invention to solve the drawbacks of the above mentioned prior art memory devices, and to provide a method for the fabrication of a high resistance load resistor having a very high resistance, in which more than Tera ohms can be achieved by a self-aligned polysilicon spacer by a anisotropic etching process in a small area of the cell. According to an aspect of the present invention, higher resistance can be provided in a limited length and the problems resulting from forming the multilayered polysilicon can be avoided.

It is a further object of the present invention to provide a high resistance load resistor having a high electrical resistance of, for example, Tera ohms, which can lower the stand-by current, and to provide a resistor which comprises a first highly doped polysilicon for conduction and a second lightly doped polysilicon for resistance thereon with both being connected by ohmic contact.

A further aspect of the present invention is to provide a high resistance load resistor which can be achieved without design rule limitation in manufacturing the highly integrated semiconductor device.

SUMMARY OF THE INVENTION

This invention relates to a method for fabricating a high resistance load resistor in a semiconductor device and to the device manufactured by the method. The method comprises forming a first oxide layer on a semiconductor substrate. A first polysilicon layer is then deposited on the first insulting oxide layer. The first polysilicon layer is etched to form a first polysilicon pad and a second polysilicon pad with the first polysilicon pad spaced apart from the second polysilicon pad. A second oxide layer is formed on the first polysilicon layer and the first oxide layer.

The second oxide layer is etched to shape the second oxide island layer to be contiguously positioned on each first and second polysilicon pad and on the first oxide layer extending between the first and second polysilicon layers. The shaped second oxide layer further includes a wall in contact with the first oxide layer and which extends from and is in contact with each of the first and second polysilicon pads. A second polysilicon spacer is formed by the anisotropic dry etching along and in contact with a portion of the sidewall of the shaped second island oxide island layer to form an electrical connection between the first and the second polysilicon pads which results in the formation of a high resistance load resistor in a static memory device. The second polysilicon spacer which is formed in the manner described, does not circumvent the shaped second oxide island layer. That is, the second polysilicon spacer is formed along the wall, with the proviso that it does not circumvent the entire sidewall of the shaped second oxide layer.

The method according to the present invention preferably includes the high doping of the first polysilicon layer with a doping source after the first polysilicon layer has been deposited. Also preferred, is the light doping of the second polysilicon layer with a doping source after the second polysilicon layer has been deposited to form a lightly doped second polysilicon layer.

Preferably, the second oxide island layer is formed having a thickness which is determined by the width of the desired second polysilicon layer spacer which will be formed.

The method of the present invention preferably includes the contact between the first polysilicon pad and the second polysilicon layer spacer and the contact between the second polysilicon pad and the second polysilicon spacer being formed by ohmic contact.

The method preferably includes the second polysilicon spacer being formed by forming a second polysilicon layer over the entire structure and subsequently etching the second polysilicon layer over the unwanted portions to provide the second polysilicon spacer.

BRIEF DESCRIPTION OF THE DRAWINGS

For fuller understanding of the nature and objects of the invention, reference should be made to the following detailed description taken in conjunction with the accompanying drawings in which.

The novel feature of the present invention may be understood from the accompanying description when taken in conjunction with the accompanying drawings.

DETAILED DESCRIPTION

Figure 1:
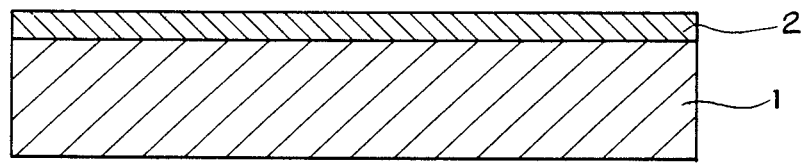
FIG. 1 illustrates a cross-section of a silicon substrate on which a first oxide layer is deposited.

FIG. 1 illustrates a cross-section of a silicon substrate 1 on which a first oxide layer 2, which functions as a insulating layer, is deposited. The first oxide layer 2 serves as an insulator dielectrics between the substrate 1 and a first polysilicon layer 3.

Figure 2:
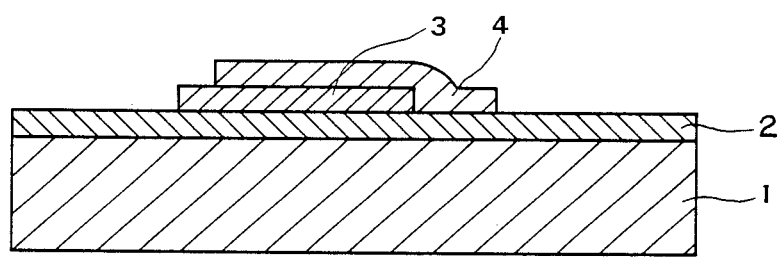
FIG. 2 illustrates a cross-section of a silicon substrate in which a first polysilicon layer is deposited on the first oxide layer, and a second oxide layer is formed on a portion of the first polysilicon layer and a portion of the first oxide layer.
Figure 6:
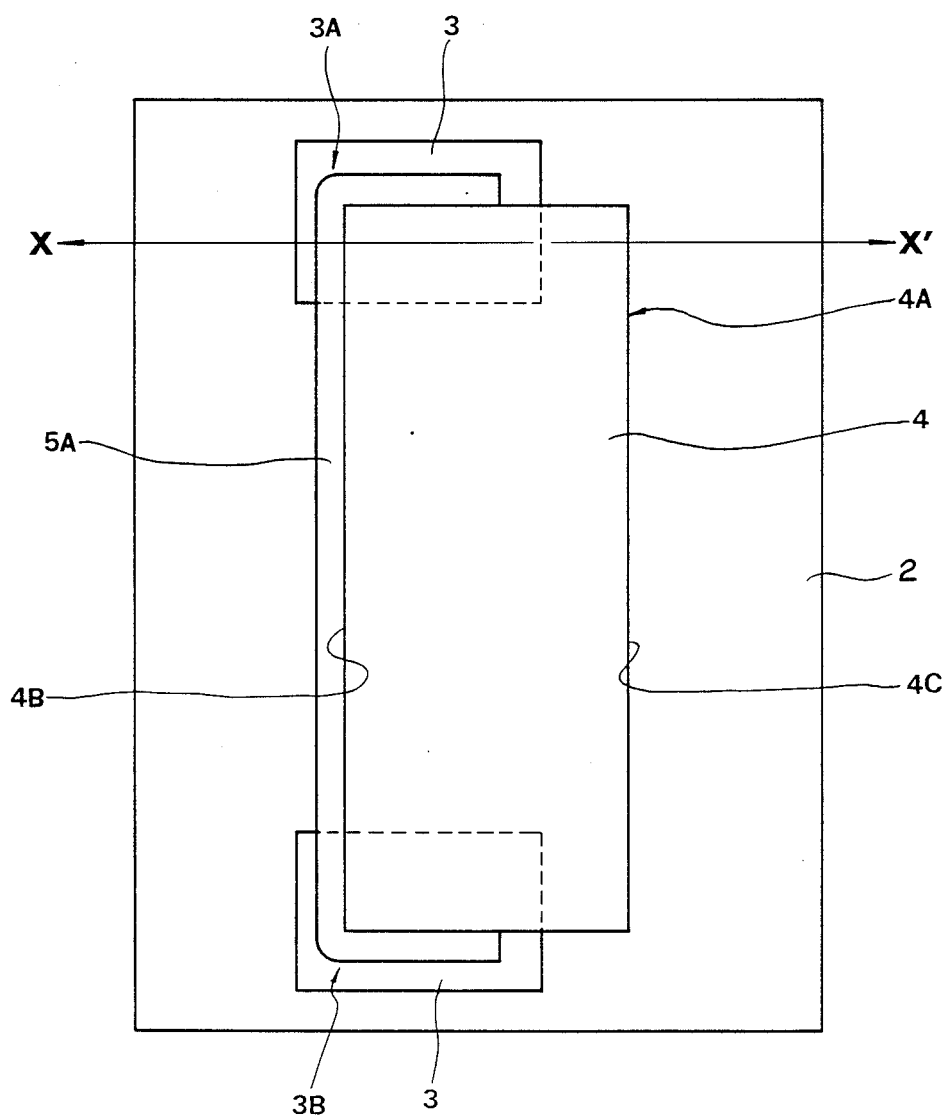
FIG. 6 illustrates a top view of a preferred embodiment of present invention in which a high resistance load resistor having a high resistance according to the present invention is formed.

FIG. 2 illustrates a cross-section of the silicon substrate in which a first polysilicon layer 3 is deposited on the first oxide layer 2. The first polysilicon layer 3 is highly doped, for example, about several $10^{20}/cm^3$, by implanting a solid source or a gas source as a doping source. Then, masking and etching is performed so as to form a pattern, thereby removing a portion of the first polysilicon layer 3, leaving a pad 3A. A second oxide layer 4 is deposited to a predetermined thickness on the first oxide layer 2 and the first polysilicon layer 3, and the second oxide layer 4 is etched by the Dry Plasma Etching, leaving only a portion of the oxide island layer 4 which extends from a portion of the top of the first polysilicon layer 3 to a portion of the top of the first oxide layer 2 as shown in FIG. 2. At this moment, preferably, the vertical sidewall of the second oxide island layer 4 is maintained relative to the underlying layer. The first polysilicon layer 3 contacts polysilicon spacers 5A and 5B to be formed by the next process, and serves either to send an electrical signal to a resistor as pad 3A, or serves to receive an electric signal as pad 3B as shown in FIG. 6. Pads 3A and 3B are operable as either sender or a receiver of an electric signal.

The second oxide island layer 4 is not an oxide for insulation to insulate between the first polysilicon layers 3 and 5, but it is formed to obtain the second polysilicon spacers 5A and 5B for providing the basic height. Therefore, the thickness of the second oxide layer 4, for example 3000 angstroms can be determined depending on the width of the second polysilicon spacers 5A and 5B to be formed by the next process and such a thickness influences the subsequent process.

Figure 3:
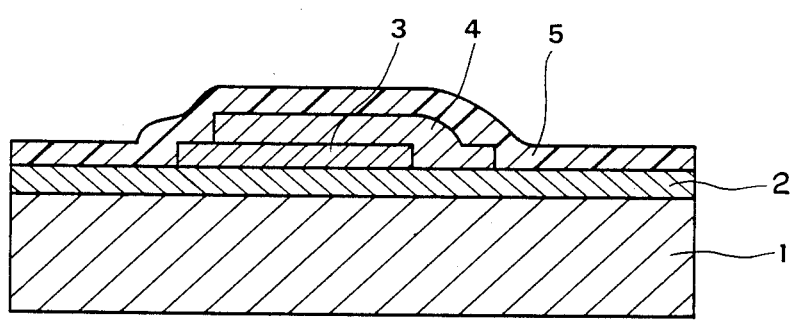
FIG. 3 illustrates a cross-section of a second polysilicon layer deposited on the first oxide layer, the first polysilicon layer and the second polysilicon shown in FIG. 2.

FIG. 3 illustrates a cross-section of a substrate on which the first oxide layer 2, the first polysilicon layer 3, the second oxide layer 4 and the second polysilicon layer 5 are sequentially deposited and the second polysilicon layer 5 is lightly doped to a level of, for example, $3 \times 10^{20}/cm^3$, by implanting a solid source or a gas sources as a doping source.

Figure 4:
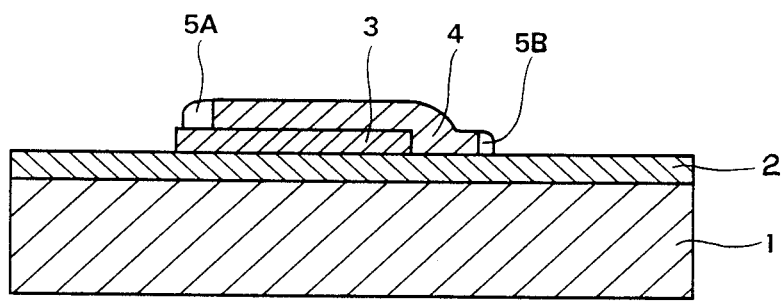
FIG. 4 illustrates a cross-section of a silicon substrate in which a second polysilicon spacer is formed on the sidewall of the second oxide layer.

FIG. 4 illustrates a cross-section in which the second polysilicon layer 5 is anisotropically etched by the Dry Plasma Etching, thereby forming the polysilicon spacers 5A and 5B along the sidewall of the second oxide island layer 4.

Figure 5:
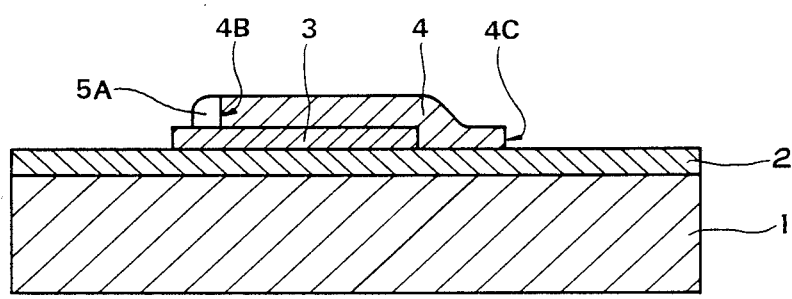
FIG. 5 illustrates a cross-section of a silicon substrate in which the unnecessary portion of the spacer is removed.

FIG. 5 illustrates a cross-section of a silicon substrate in which unnecessary polysilicon spacer 5B of the second polysilicon spacers 5A and 5B, which is positioned at the right side of the oxide layer 4, is removed by utilizing the filament mask.

FIG. 6 illustrates a top view of a silicon substrate in which two pads 3A and 3B of the first polysilicon layer 3 are formed and the second polysilicon spacer 5A is connected by ohmic contact to two pads 3A and 3B of the first polysilicon layer 3 along a portion of the sidewall 4B of the shaped second oxide layer 4, thereby forming a load resistor having high resistance.

As illustrated, the sidewall 4A which circumvents layer 4 includes a portion 4B which is provided with second polysilicon spacer 5A and a portion 4C which does not include a spacer, which was removed during a previous step. That is, the second polysilicon spacer 5A does not go completely around the sidewall 4A of shaped second oxide layer 4.

As shown in the drawings, FIG. 1 to FIG. 5 illustrate cross-sections of FIG. 6 taken along the line x—x'.

As described above, even though the design redundancy is diminished as the semiconductor devices are highly integrated, since the structure according to the present invention has such structure that the lightly doped second polysilicon spacer, which can form a high resistive load and can reduce a sectional square area of the device to a minimum design limitation, is connected by ohmic contact to the highly doped first polysilicon pad positioned thereunder, it can serve as resistive element having a high resistance can be obtained with a rather small area is achieved, thereby enabling the design of very large scale or super integrated semiconductor devices.

The foregoing description of the preferred embodiment has been presented for the purpose of illustration and description. It is not intended to limit the scope of this invention. Many modifications and variations are possible in the light of the above teaching. It is intended that the scope of the invention be defined by the claims.

What is claimed is:

1. A method for the fabrication of high resistance load resistor in a static memory device, the method comprising:

depositing a first insulating oxide layer on a semiconductor substrate;

depositing a first polysilicon layer on the first insulating oxide layer;

etching the first polysilicon layer to form a first polysilicon pad and a second polysilicon pad with the first polysilicon pad spaced apart from the second polysilicon pad;

forming a second oxide layer on the first polysilicon layer and the first oxide layer;

etching the second oxide island layer thereby shaping the second oxide layer to be contiguously positioned on each first and second polysilicon pad and on the first oxide layer extending between the first and second polysilicon pads and with the shaped second oxide island layer having a sidewall in contact with the first oxide layer and extending from and in contact with each of the first and second polysilicon pads; and forming a second polysilicon spacer by the anisotropic etching process along and in contact with a portion of the sidewall of the shaped second oxide island layer to form an electrical connection between the first and the second polysilicon pads thereby forming a high resistance load resistor in a static memory device.

2. The method of claim 1 which further comprises highly doping the first polysilicon layer with a doping source after the first polysilicon layer has been deposited to form a highly doped first polysilicon layer.

3. The method of claim 1 which further comprises lightly doping the second polysilicon layer with a doping source after the second polysilicon layer has been deposited to form a lightly doped second polysilicon layer.

4. The method of claim 1 which further comprises forming the second oxide island layer the thickness of which is determined by the width of the desired second polysilicon layer spacer.

5. The method of claim 1 wherein the contact between the first polysilicon pad and the second polysilicon spacer and the second polysilicon pad and the second polysilicon spacer are formed by ohmic contact.

6. The method of claim 1 wherein the second polysilicon layer spacer is formed by depositing a second polysilicon layer over the entire structure and subsequently etch the second polysilicon layer over the unwanted portions to provide the second polysilicon layer spacer.

* * * * *